(12) United States Patent
Chen et al.

(10) Patent No.: US 11,183,437 B2
(45) Date of Patent: Nov. 23, 2021

(54) CIRCUIT PACKAGE

(71) Applicant: Hewlett-Packard Development Company, L.P., Spring, TX (US)

(72) Inventors: Chien-Hua Chen, Corvallis, OR (US); Michael W. Cumbie, Corvallis, OR (US); Stephen Farrar, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 135 days.

(21) Appl. No.: 16/737,361

(22) Filed: Jan. 8, 2020

(65) Prior Publication Data

US 2020/0144148 A1     May 7, 2020

Related U.S. Application Data

(62) Division of application No. 15/763,865, filed as application No. PCT/US2015/060841 on Nov. 16, 2015, now Pat. No. 10,559,512.

(51) Int. Cl.
| | |
|---|---|
| *B41J 2/14* | (2006.01) |
| *H01L 23/31* | (2006.01) |
| *H01L 23/48* | (2006.01) |
| *H01L 23/00* | (2006.01) |
| *H01L 21/56* | (2006.01) |
| *H01L 23/29* | (2006.01) |

(52) U.S. Cl.
CPC ............ *H01L 23/3135* (2013.01); *B41J 2/14* (2013.01); *H01L 21/565* (2013.01); *H01L 23/293* (2013.01); *H01L 23/48* (2013.01); *H01L 23/562* (2013.01)

(58) Field of Classification Search
CPC ... H01L 23/3135; H01L 23/48; H01L 23/562; H01L 21/565; H01L 23/293; B41J 2/14
See application file for complete search history.

(56) References Cited

U.S. PATENT DOCUMENTS

| | | | |
|---|---|---|---|
| 6,020,648 | A | 2/2000 | Macpherson |
| 6,516,513 | B2 | 2/2003 | Milkovich et al. |
| 7,179,689 | B2 | 2/2007 | Matayabas et al. |
| 7,658,988 | B2 | 2/2010 | Lin et al. |
| 8,823,186 | B2 | 9/2014 | Sekiguchi |
| 2008/0237896 | A1 | 10/2008 | Cho |

(Continued)

FOREIGN PATENT DOCUMENTS

| | | |
|---|---|---|
| CN | 101541499 | 9/2009 |
| CN | 102543900 | 7/2012 |

(Continued)

OTHER PUBLICATIONS

Liu, H. et al., "CTE Difference Decrease of Epoxy Molding Compound After Molding and After PMC", Aug. 11-14, 2013, 4 pages.

*Primary Examiner* — Scott A Richmond
(74) *Attorney, Agent, or Firm* — Trop Pruner & Hu PC

(57) ABSTRACT

In some examples, a circuit package includes a packaging, and a circuit device in the packaging, where the packaging comprises a first EMC having a first coefficient of thermal expansion (CTE), and a second EMC having a second CTE higher than the first CTE. The second EMC is on the first EMC that has gelled over time.

18 Claims, 7 Drawing Sheets

(56) References Cited

U.S. PATENT DOCUMENTS

| | | | |
|---|---|---|---|
| 2009/0186454 A1* | 7/2009 | Miyawaki | H01L 33/483 |
| | | | 438/127 |
| 2009/0309238 A1 | 12/2009 | Loke | |
| 2010/0065983 A1 | 3/2010 | Kawakubo | |
| 2010/0133722 A1 | 6/2010 | Watanabe | |
| 2010/0184256 A1* | 7/2010 | Chino | H01L 23/488 |
| | | | 438/118 |
| 2010/0213621 A1 | 8/2010 | Sun et al. | |
| 2012/0091579 A1 | 4/2012 | Park et al. | |
| 2012/0168951 A1 | 7/2012 | Kim et al. | |
| 2015/0380335 A1 | 12/2015 | Yuji | |

FOREIGN PATENT DOCUMENTS

| | | |
|---|---|---|
| JP | 2010179507 | 8/2010 |
| JP | 2011243801 | 12/2011 |
| WO | WO-9820549 A1 | 5/1998 |
| WO | WO-2007083352 | 7/2007 |
| WO | WO-2015037349 | 3/2015 |

\* cited by examiner

CIRCUIT PACKAGE

CROSS REFERENCE TO RELATED APPLICATIONS

This is a divisional of U.S. application Ser. No. 15/763,865, having a national entry date of Mar. 28, 2018, which is a national stage application under 35 U.S.C. § 371 of PCT/US2015/060841, filed Nov. 16, 2015, which are both hereby incorporated by reference in their entirety.

BACKGROUND

Circuits such as integrated circuits are oftentimes packaged in an epoxy mold compound (EMC) package to support and protect the circuitry. Often, the EMC includes an epoxide functional group.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
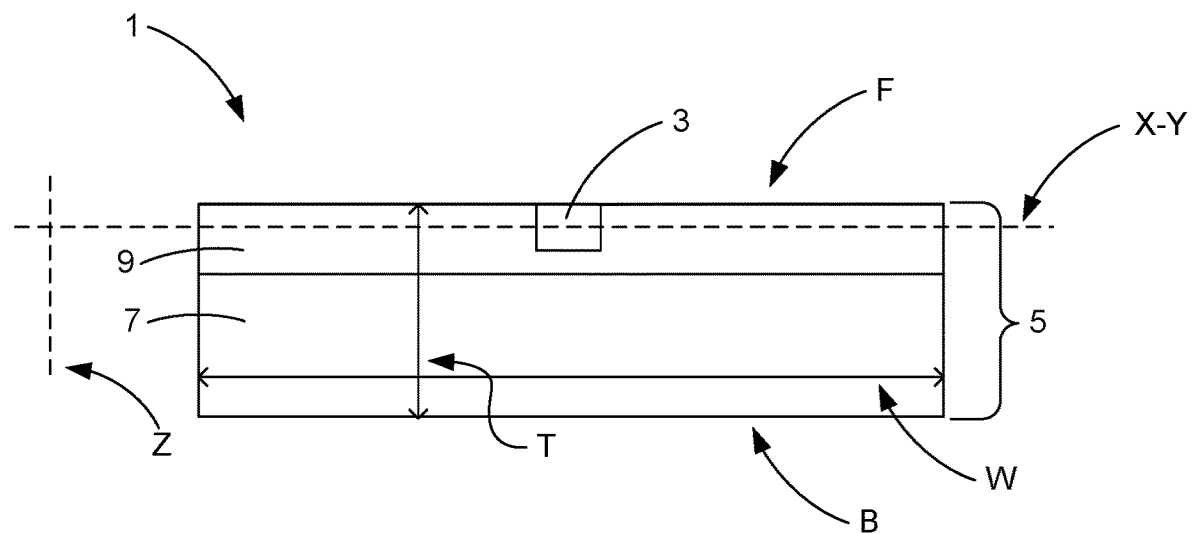
FIG. 1 is a block diagram of a circuit package according to one example of the principles described herein.

As mentioned above, a circuit such as an integrated circuit may be packaged in an epoxy mold compound (EMC). Panel warpage control is a challenge of fan out wafer level packaging (FO-WLP) applications. The integrated circuit (IC) packaging industry has implemented multiple techniques to solving panel warpage issue, including low temp mold processes (processes conducted under ~130° C. or less), thinner silicon die, lower coefficient of thermal expansion (CTE) epoxy mold compounds (EMCs), clamping during cool down, among others. The issue may arise during the formation of the packaging where the differing coefficients of thermal expansions (CTEs) among the circuit and the EMC may cause the packaged circuit to warp or bend upon solidification and cooling of the EMC.

The present specification, therefore describes a method of molding a circuit including depositing a first epoxy mold compound (EMC) over a cavity, upon the first EMC gelling over a predetermined period of time, depositing a second EMC over the first EMC, and depositing a circuit in at least one of the first and second epoxy mold compounds.

The present specification further describes a circuit package including a packaging and a circuit device in the packaging, wherein the packaging comprises a first EMC with a first CTE and a second EMC with a second CTE higher than the first CTE, the second EMC being dispensed onto the first EMC after the first EMC is allowed to gel to a predetermined degree.

The present specification further describes a method of forming a fluidic circuit package, including depositing a first epoxy mold compound (EMC) over a cavity, the first EMC having a number of fluid holes defined therein, cooling the first EMC until the first EMC gels, depositing a second EMC over the first EMC, and depositing a number of fluidic circuit devices into the second EMC wherein the number of fluid holes align with the placement of the fluidic circuit devices.

As used in the present specification and in the appended claims, the term "epoxy molding compound (EMC)" is broadly defined herein as any materials including at least one epoxide functional group. In one example, the EMC is a self-cross-linking epoxy. In this example, the EMC may be cured through catalytic homopolymerization. In another example, the EMC may be a polyepoxide that uses a co-reactant to cure the polyepoxide. Curing of the EMC in these examples creates a thermosetting polymer with high mechanical properties, and high temperature and chemical resistance.

Additionally, as used in the present specification and in the appended claims the term "gel" is meant to be understood as a dilute cross-linked system that exhibits no flow when in the steady-state. The term "gel" can also mean the process by which a substances forms into a gel.

Further, as used in the present specification and in the appended claims, the term "a number of" or similar language is meant to be understood broadly as any positive number comprising 1 to infinity.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Turning now to the figures, FIG. 1 is a block diagram of a circuit package (1) according to one example of the principles described herein. The circuit package (1) may include a circuit device (3) and a packaging (5). The packaging (5) serves to support and protect the circuit device (3). In an example additional circuitry may run through the packaging (5), connected to the circuit device (3).

In an example, the packaging (5) comprises a first epoxy mold compound (EMC) (7) with a first CTE (coefficient of thermal expansion) and a second EMC (9) with a second CTE. In an example the second CTE is higher than the first CTE. In an example, the second CTE is lower than the first CTE. The second EMC (9) may be dispensed adjacent to the circuit device (3), for example, so as to influence a bow near a face of the circuit package (1) that includes the circuit device (3).

In one example, the circuit package (1) is substantially panel-shaped. The panel-shaped circuit package (1) may have a front surface (F) and a back surface (B). Both the circuit device (3) and the second EMC (9) may extend near the front surface (F). In the illustrated example of FIG. 1, the second EMC (9) extends in the same plane (X-Y) as the circuit device (3), wherein the plane (X-Y) extends parallel to the front and back surface (F, B) of the panel, and near the front surface (F). In an example, most of the volume of the package (5) is formed by the first EMC (7). In the illustrated example, the first EMC (7) extends below the second EMC (9) up to the back surface (B).

The circuit package (1) has a panel shape in the sense that it has a thickness (T), between a back and front surface (B, F), that is relatively less than its width (W) or length. In one example, the circuit package's (1) thickness (T) can be at least five times, or at least ten times less than its width (W) and/or length (in FIG. 1, the length extends into the page). In FIG. 1, the thickness extends in a Z-direction while the length and width (W) extend parallel to the X-Y plane.

The circuit device (3) may include metal and/or semi-conductor components such as silicon. The circuit device (3) may have a lower CTE than the first EMC (7). In an example the circuit device (3) may include approximately 3.1 parts per million per ° C. rise in temperature (ppm/C).

In a number of examples, the circuit package (1) is manufactured by compression molding. In a number of examples, before compression molding the circuit devices (3) in the packaging (5), the EMCs (7, 9) are provided in granular, powder, layered and/or B-staged sheet form. Compression molding, for example, may involve heating the layers, sheets or granular EMCs (7, 9) in a mold, compressing a number of circuit devices (3) and compounds to form the circuit package (1), and cooling and/or allowing the package (1) to cool. As will be described below in more detail, the method used to form the circuit package may include first depositing a layer of first EMC (7) into a cavity and allowing that layer of first EMC (7) to gel. During the cooling process, EMC may solidify forming a stiff substrate. In one example, the amount of time that the layer of first EMC (7) gels may be between 20 to 60 seconds. In one example, the time that the layer of the first EMC (7) gels may be between 5 and 60 seconds. In this time, some of the first EMC (7) may cure faster than others and the first EMC (7) may be at varying curing points or solidification points based on the time that has passed between heating of the first EMC (7) and the cooling of the EMC (7). At some point in time, the first EMC (7) may form a gel such that the first EMC (7) is semirigid. This may allow a second EMC (9) to be deposited onto the first EMC (7) without the two EMCs (7, 9) mixing or at least preventing a homogeneous mixture of the first (7) and second EMCs (9) from becoming a homogeneous mixture. Additionally, allowing the first EMC (7) to gel may allow, for example, a circuit device (3) to be inserted through the second EMC (9) and into the first EMC (7).

In a number of examples, the circuit devices (3) may comprise conductor and/or semi-conductor materials. In this example, the coefficient of thermal expansion (CTE) of the circuit device (3) and the CTE of the first EMC (7) may be different. As a consequence of these differing CTEs, warpage could occur during cooling of the circuit package (1), if the circuit device (3) would be packaged in the first EMC (7) alone.

In a number of examples presented in this disclosure, a second EMC (9) with, in one example, a relatively higher CTE than the CTE of the first EMC (7) is deposited adjacent to the circuit device (3) to control said warpage or bow. In a number of examples, the second EMC (9) is dispensed in a predetermined quantity (e.g. thickness, surface) and location near the circuit device (3), so as to influence an overall CTE of a "composite" portion of the package (1) that incorporates both the circuit device (3) and the second EMC (9), near the front surface (F). For example, the CTE of the composite portion may be such that the thermal expansion of the composite portion compensates for the thermal expansion of the opposite back portion that may substantially consist of the first EMC (7).

In a number of examples, when a circuit device (3) is packaged in a single EMC, the resulting circuit package (3) may curve into a shape that is convex at the front surface (F) where the circuit device (3) is located, and concave at the opposite, back surface (B). To counter such curving, a layer of a second EMC (9) with, in one example, a higher CTE than the first EMC (7) can be dispensed near a number of the circuit devices (3). By dispensing a layer of the second EMC (9), an overall thermal expansion (or shrinking) of the composite layer during cooling may be similar, or of inverse shape, as the thermal expansion near the back surface (B). Thereby the layer of the second EMC (9) may compensate for the deformation near the back surface. Positions, shapes and quantities of the second EMC (9) and the first EMC (7) can be varied to control a bow or warpage of the circuit package (1). Additionally, the CTE of the second EMC (9) and the first EMC (7) can be varied to further control the bow or warpage of the circuit package (1). By having control over panel bow in compression molded circuit packages, certain design constraints can be relieved, such as circuit device thickness (versus length and width), number of circuit devices in a packaging, packaging thickness, mold temperature settings, substrate handling downstream of a compression mold such as an electrical redistribution layer (RDL) fabrication process, packaging clamping during cooling, and more. Additional, example circuit packages are described below.

Figure 2:
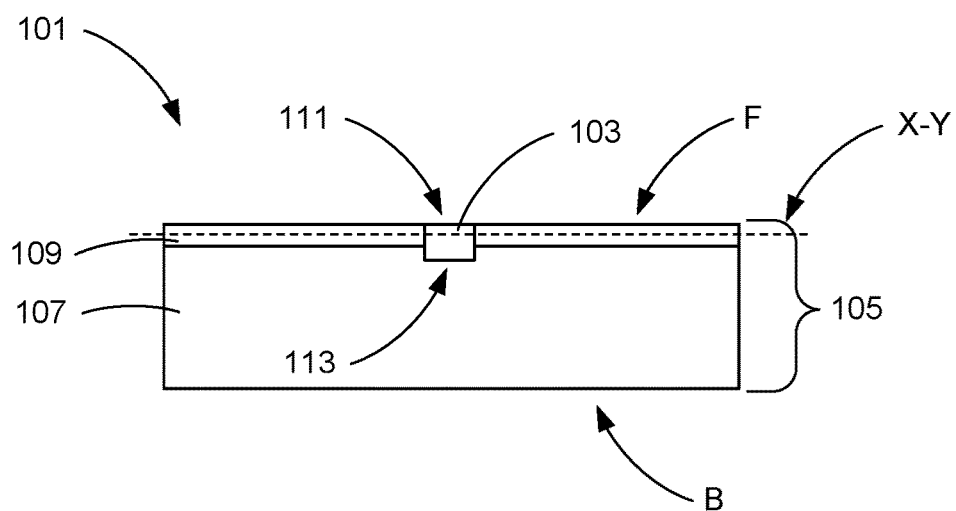
FIG. 2 is a block diagram of a circuit package according to one example of the principles described herein.

FIG. 2 is a block diagram of a circuit package (101) according to one example of the principles described herein. The circuit package (101) may be panel shaped and includes a packaging (105) and a circuit device (103). The circuit package (101) includes a relatively thin second layer of a second EMC (109) that is dispensed over a first layer of a first EMC (107). The second EMC (109), in one example, has a higher CTE than the first EMC (107). In this example, the second EMC (109) may have a lower filler density or filler diameter than the first EMC (107). The circuit device (103) extends in or near a front surface (F). The second layer of the second EMC (109) extends in the same plane (X-Y) as the circuit device (103). The plane X-Y extends parallel to the front surface (F) and a back surface (B) of the circuit package (101), near the front surface (F). In one example, the first EMC (107) forms the bulk of the packaging 105 and forms the back surface B of the packaging (105).

The CTE of the first (107) and second EMC (109) can be altered by varying the weight percentage of the fillers in the compound, also referred to as filler density. In one example, the CTE of an EMC material is inversely proportional to the filler content. In one example, the filler may be silica. Throughout this specification, certain examples may be provided where certain EMCs may include differing CTEs. The present specification contemplates that in order to alter any EMCs CTE fillers having certain filler diameters, lengths, and/or weights may be added to the EMC. In another example, the differing CTEs among the EMCs may be dependent on the volume percentages of added fillers or other components. For example, a filler diameter can influence certain surface characteristics of laser ablated or cut panel parts.

In the example shown in FIG. 2, the second layer of the second EMC (109) is thinner than a height of the circuit device (103) so that a front portion (111) of the circuit device (103) extends in the second EMC (109) while a back portion (113) of the circuit device (103) extends in the first EMC (107) that extends below the second EMC (109). During compression molding, for example, the circuit device (103) may be deposited into and partly through the second EMC (109) so that the back portion (113) sits in the first EMC (107). This example may work where a thin slice of EMC (109), having a relatively high CTE compared to the first EMC (107) layer, is to be used to control panel bow.

Figure 3:
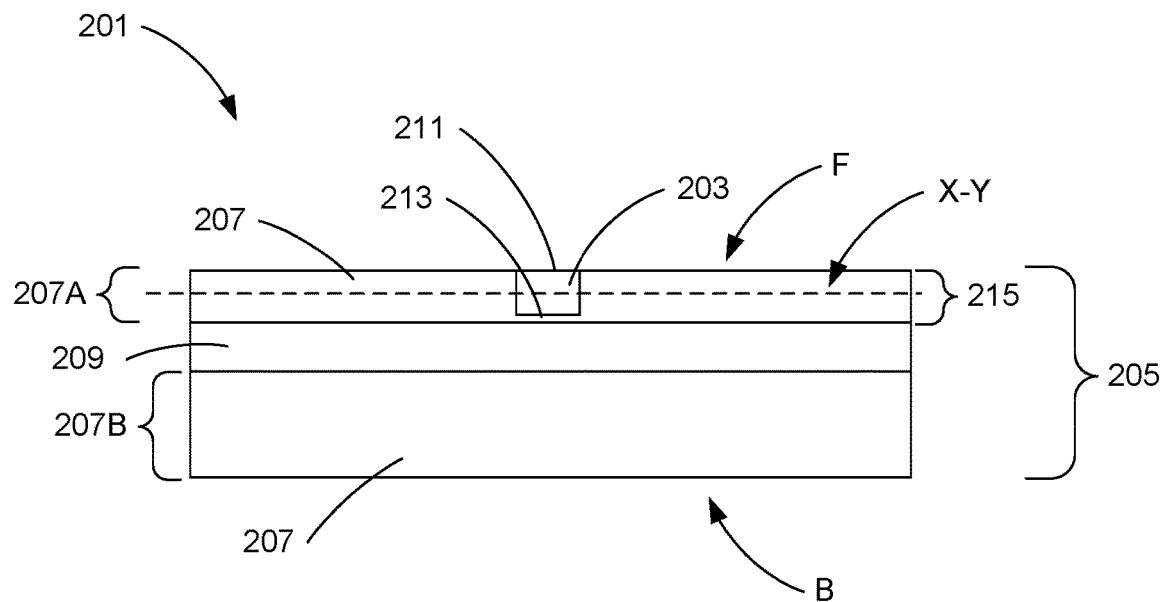
FIG. 3 is a block diagram of a circuit package according to one example of the principles described herein.

FIG. 3 is a block diagram of a circuit package (201) according to one example of the principles described herein. The circuit package (201) may be panel shaped and may include a packaging (205) and a circuit device (203) in the packaging (205). The circuit package (201) has a front (F) and back surface (B). The packaging (205) may include layers of a first EMC (207) having a first CTE and a second EMC (209) having a second CTE. In one example, the second EMC (209) may have a CTE value higher than that of the first EMC (207). The layer of the second EMC (209) extends near the circuit device (203) and near the front surface (F), parallel to a plane (X-Y) through the circuit device (203). In FIG. 3, the second EMC (209) extends under the circuit device (203) and under the plane (X-Y). Two layers (207A, 207B) of the first EMC (207) may extend along the front and back side, respectively, of the second EMC (209). A relatively thin layer (207A) of the first EMC (207) extends in the same plane (X-Y) as the circuit device (203), at the front surface (F) and parallel to the front surface (F). In the example, the circuit device (203) is fully deposited in that layer (207A) of the first EMC (207). A back layer (207B) of the first EMC (207), which may represent most of the volume of the packaging (205), may extend on the opposite side of the second EMC (209), at the back of the packaging (205). As a result, the overall panel warpage can be controlled or reduced, relative to a package of a single epoxy compound.

In the example of FIG. 3, the second EMC (209) may compensate for a bow that could otherwise be caused by the different CTEs of the circuit device (203) and the first EMC (207). For example, the second EMC (209) is close enough to the front surface (F) and/or circuit devices (203) to influence an overall thermal expansion near the front surface (F), to compensate for the thermal expansion near the back surface (B) of the compression molded package (201).

In another example similar to FIG. 3, the front epoxy mold compound layer (207A) of the first EMC (207) may be thinner and the second EMC (209) layer could be moved upwards so that it touches the circuit device (203). A back portion (213) of the circuit device (203) may then be dispensed in the second EMC (209) and a front portion of the circuit device (203) in the first EMC (207).

Figure 4:
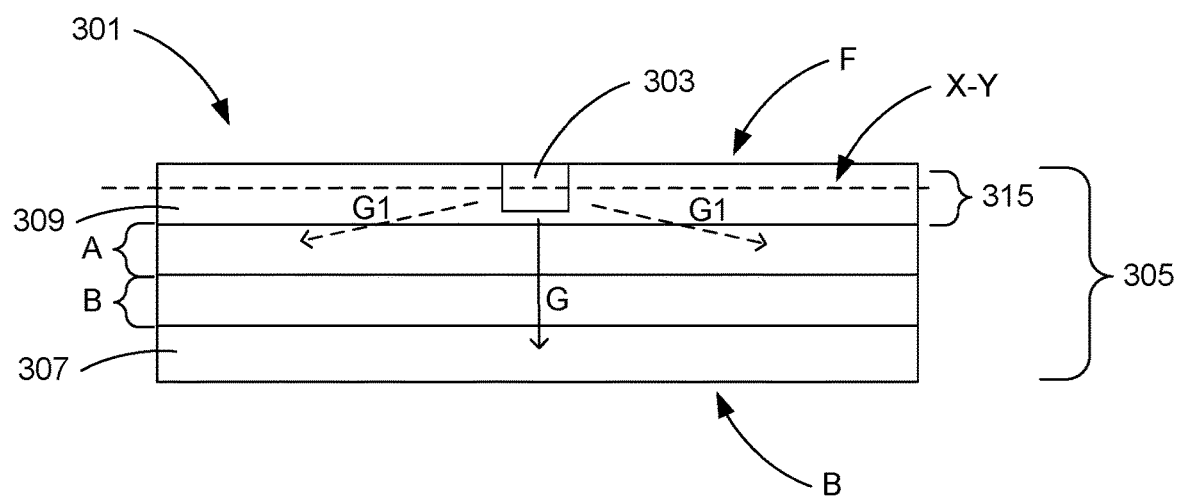
FIG. 4 is a block diagram of a circuit package according to one example of the principles described herein.

FIG. 4 is a block diagram of a circuit package (301) according to one example of the principles described herein. The circuit package (301) may include a circuit device (303) and a packaging (305). The packaging (305) includes a first EMC (307) near a back surface (B) and a second EMC (309) near a front surface (F), wherein, in one example, the second EMC (309) has a higher CTE value than the first EMC (307). In one example, the CTE of the first EMC (307) has a higher CTE value than the second EMC (309). The second EMC (309) may be dispensed in a plane (X-Y) that extends through the circuit device (303) parallel to the front (F) and back surface (B) of the circuit package (301), near the front surface (F). The first EMC (307) is dispensed near a back surface (B).

The CTE of the packaging (305) decreases gradually, for example in stages or layers (A, B) from a front surface (F) to a back surface (B). The CTE can decrease in a direction (G) away from a circuit device layer (315), for example in a direction (G) perpendicular to said plane (X-Y) through the circuit devices (303). In other examples, as illustrated with dotted arrows (G, G1), the epoxy mold compounds (307, 309) are dispensed in the packaging (305) so that the CTE decreased in multiple directions (G, G1) away from the circuit device (303). In an example the packaging (305) contains 100% first EMC (307) having a first CTE near the back surface (B) and 100% second EMC (309) having a second CTE near the front surface (F).

Figure 5:
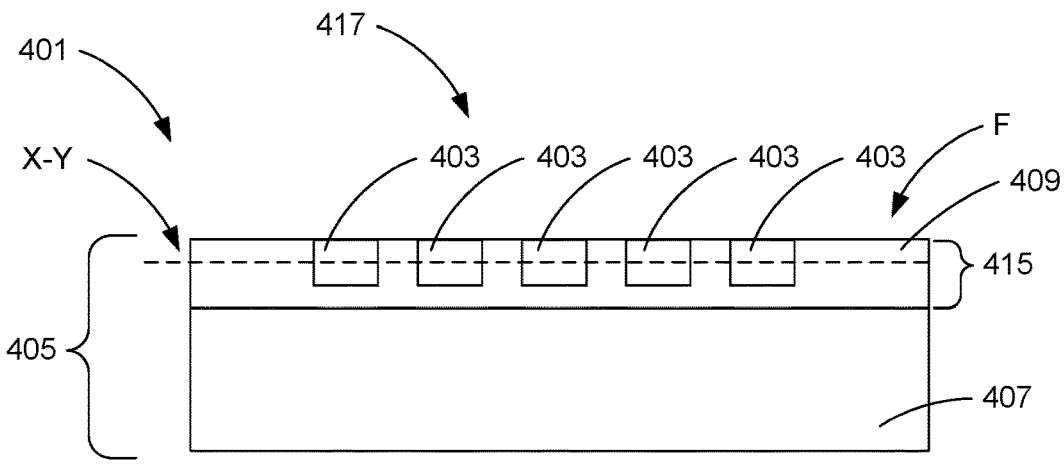
FIG. 5 is a block diagram of a circuit package including a packaging and a number of circuit device according to one example of the principles described herein.

FIG. 5 is a block diagram of a circuit package (401) including a packaging (405) and a number of circuit devices (403) according to one example of the principles described herein. The circuit package (401) includes an array (417) of circuit devices (403) in a circuit device layer (415). The circuit device layer (415) may be provided near a front surface (F) of the circuit package (401). In the circuit device layer (415), the circuit devices (403) of the circuit device array (417) extend next to each other, for example in columns and/or rows. In the example, the circuit devices (403) extend up to the front surface (F).

The packaging (405) may include a first EMC (407) and a second EMC (409) having a higher CTE than the first compound. In the example shown in FIG. 5, the first EMC (407) forms a back portion of the packaging (405) near a back surface (B). In an example, the first EMC (407) may form the bulk of the material of the packaging (405). The second EMC (409) extends near the front surface (F) in the same plane (X-Y) as the circuit device array (417).

The circuit device array (417) may be applied to each of the examples of this description. For example, each of the individual circuit devices (3, 103, 203, 303) of each of the examples of FIG. 1-4 could be an array (417) of circuit devices as in FIG. 5 wherein the array (417) extends in the respective first (407) and/or second EMC (409) layer.

Figure 6:
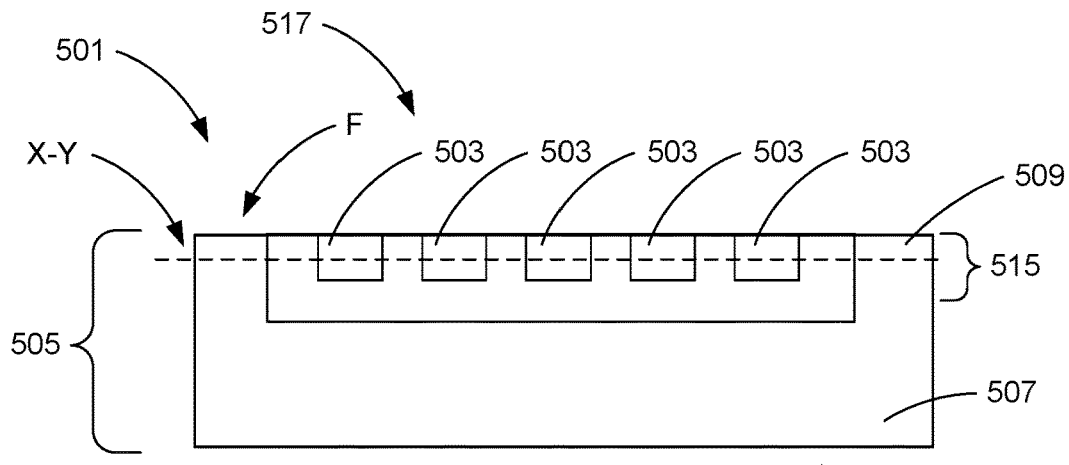
FIG. 6 is a block diagram of a circuit package according to one example of the principles described herein.
Figure 7:
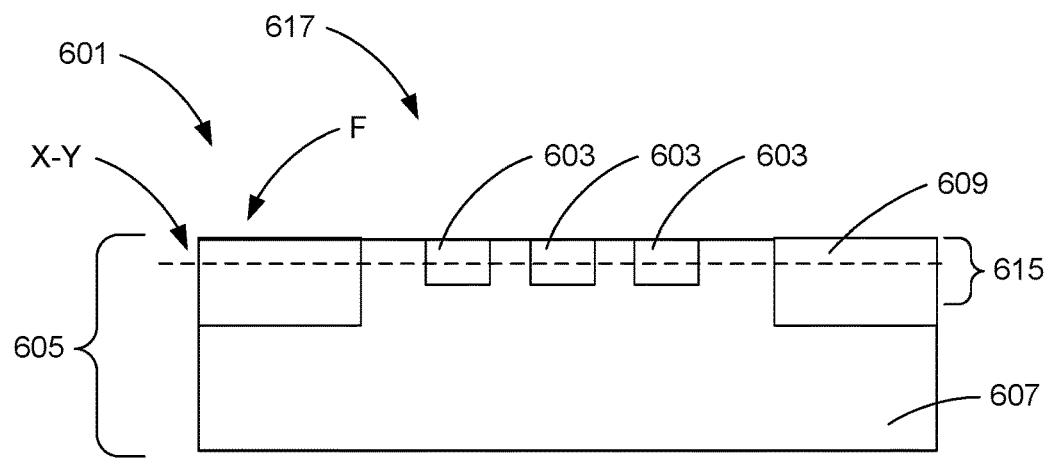
FIG. 7 is a block diagram of a circuit package according to one example of the principles described herein.

FIG. 6 is a block diagram of a circuit package according to one example of the principles described herein. FIG. 7 is a block diagram of a circuit package according to one example of the principles described herein. FIGS. 6 and 7 illustrate examples of circuit packages (501, 601), wherein the second EMC (509, 609) of, in one example, a higher a CTE is patterned in a first EMC (507, 607), in a plane (X-Y) through the circuit devices (503, 603) near the front surface (F). In these examples, a pattern may be interpreted as the second EMC (509, 609) spanning a selective portion less than the whole of a panel surface. Here, the first EMC (507, 607) spans the entire panel surface. In FIG. 6, the circuit devices (503) may be dispensed in the second EMC (509). In FIG. 7, the circuit devices (603) may be dispensed in the first EMC (607) and the second EMC (609) extends next to the circuit array (617) and next to and on top of the first EMC (607). In both examples, the second epoxy mold compound (509, 609) may extend near the circuit devices (503, 603), in a circuit device layer (515, 615), and may thereby compensate for potential bow that could otherwise be incurred by the different thermal expansions between the circuit device array (517, 617) and the first EMC (507, 607).

Figure 8:
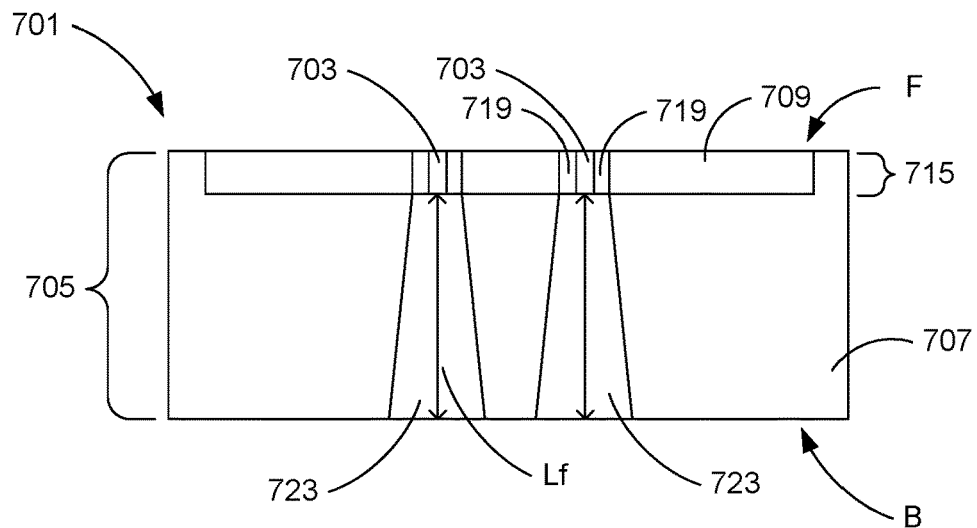
FIGS. 8 and 9 are block diagrams showing a panel-shaped fluidic circuit package in a cross sectional side view and in a top view, respectively according to one example of the principles described herein.
Figure 9:
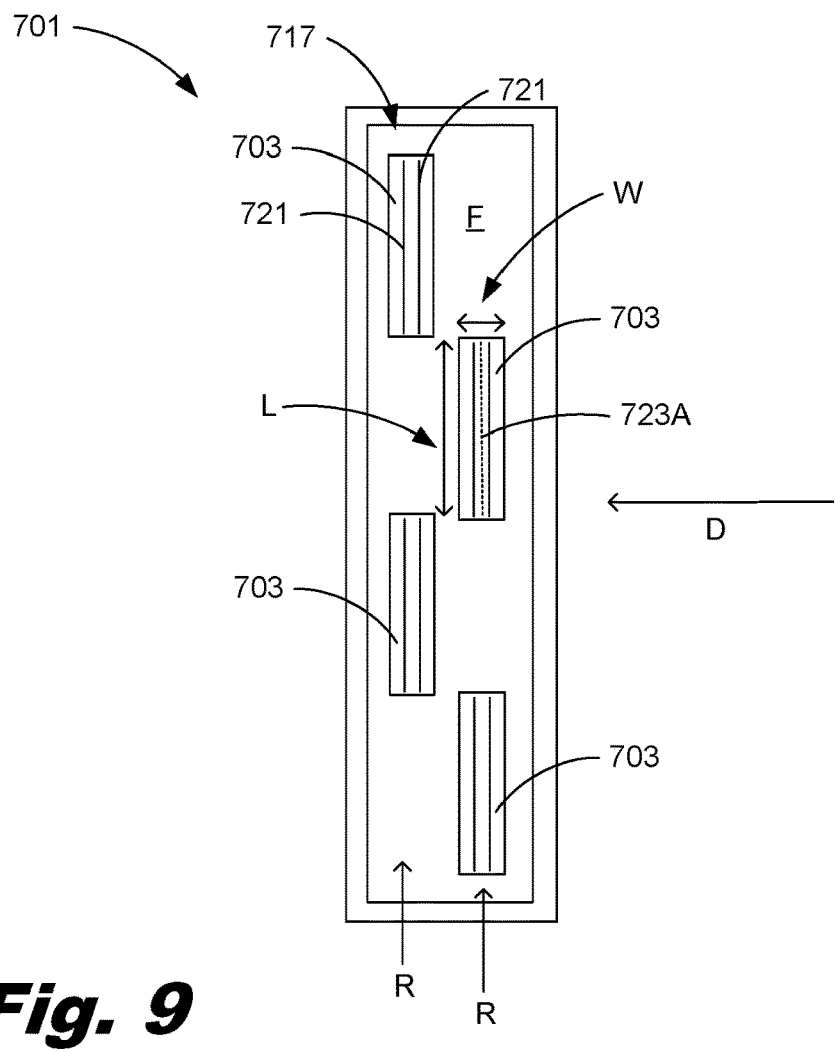

FIGS. 8 and 9 are block diagrams showing a panel-shaped fluidic circuit package (701) in a cross sectional side view and in a top view, respectively according to one example of the principles described herein. The fluidic circuit package (701) includes a packaging (705) of a first and second EMC (707, 709), respectively, wherein the second EMC (709), in one example, has a higher CTE than the first EMC (707). In one example, the second EMC (709) has a lower CTE than the first EMC (707). An array (717) of fluidic circuit devices (703) is dispensed in a circuit device layer (715) near a front surface (F). In this example the circuit device layer (715) defines the front surface F.

The fluid circuit package (701) may be a component of a high precision digital liquid dispensing module such as a media wide array print bar for two-dimensional or three-dimensional printing. The fluid circuit devices (703) may be shaped like relatively thin slivers, and may include silicon material. Each of the circuit devices (703) may include channels (719) to transport fluid (FIG. 8). In an example the fluid circuit devices (703) include nozzles at respective ends of the channels (719). Certain actuators such as resistors may be defined in the channels (719) near the nozzles, for example in respective chamber portions of the channels. Arrays (721) of nozzles may open into the front surface (F) (FIG. 9). A nozzle density of one row of nozzles may for example be at least approximately 300 nozzles per inch, at least 600 nozzles per inch, at least 900 nozzles per inch, at least 1200 nozzles per inch, or more. In an example, each fluid circuit devices (703) is provided with at least two nozzle arrays (721). Besides being relatively thin, in a further example, the fluid circuit devices (703) have a relatively small width (W) and long length (L). For example a ratio of length (L) versus width (W) may be at least approximately 25:1 or at least 50:1. The fluid circuit devices (703) may be arranged in two rows (R) so that subsequent nozzle arrays (721) in opposite rows (R) overlap so as to have continuous coverage of nozzle arrays as seen from a side direction (D) perpendicular to said length (L) of the fluid circuit devices (703), as best illustrated by FIG. 9.

The packaging (705) may include through bores in the form of fluid holes (723) to deliver fluid to each of the fluid circuit devices (703). In an example, average cross-sectional diameters of the fluid holes (723) are larger than the average cross sectional diameters of the fluid channels (719) of the fluid circuit devices (703). The fluid holes (723) open into the back surface (B) of the packaging (705) and lead to each of the fluid circuit devices (703). An array (723A) of fluid holes (723) may extend into the drawing, parallel to each of the nozzle arrays 721, as illustrated by a dotted line in one of the fluid circuit devices (703) in FIG. 9. One row of fluid holes (723) may guide fluid to two nozzle arrays (721). The fluid holes (723) may open in to a manifold channel that leads to both nozzle arrays (721).

In a number of examples, most of the length (Lf) of the fluid holes (723) extends through the first EMC (707). For example, the fluid holes (723) extend entirely in the first EMC (707). In another example, a final portion of the fluid holes (723), near the fluid circuit devices (703) extend through the second EMC (709).

In one example, the packaging (705) may by formed by depositing the first EMC (707) into the cavity. In one example, the cavity may include a number of features therein that prevent the first EMC from occupying the space. These features may be used to form the fluid holes (723) described above as the first EMC (707) is allowed to gel. In other examples, the fluid holes (723) may be formed after the fluid circuit devices (703) have been deposited into the first EMC (707) and the first (707) and second EMCs (709) have hardened. In this example, the fluid holes (723) may be formed via laser ablation or some other material removal method.

Figure 10:
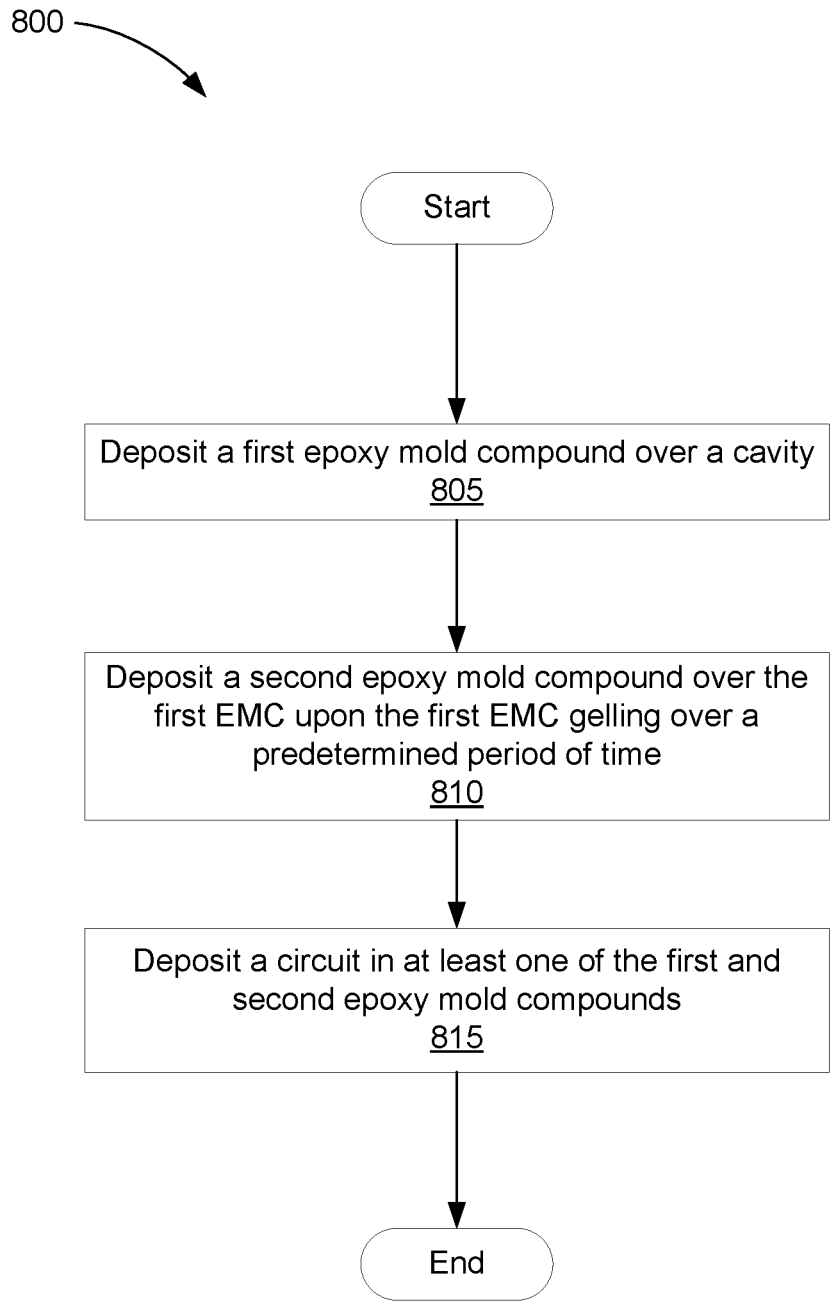
FIG. 10 is a flowchart showing method of molding a circuit according to one example of the principles described herein.
Figure 11A:
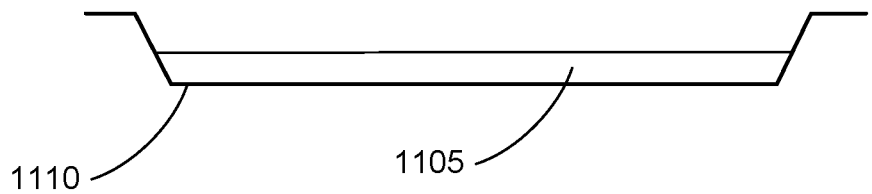
FIGS. 11A-11C are block diagrams showing the method of molding a circuit of FIG. 10 according to one example of the principles described herein.
Figure 11B:
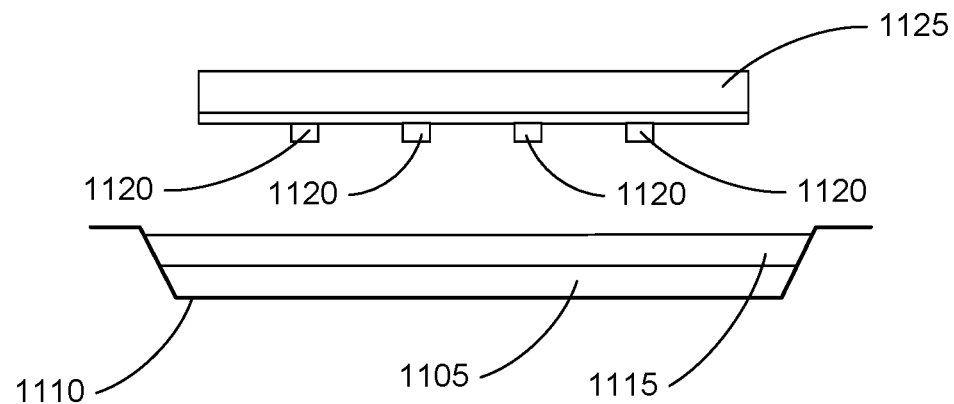

FIG. 10 is a flowchart showing method (800) of molding a circuit according to one example of the principles described herein. FIGS. 11A and 11B are block diagrams showing the method of molding a circuit of FIG. 10 according to one example of the principles described herein. The method may begin with depositing (805) a first EMC (1105) over a cavity (1110). In one example, first EMC (1105) is in a granular form. In this example, the method (800) may further include heating the first EMC (1105) while the granular first EMC (1105) is in the cavity (1110). In another example, the first EMC (1105) may be heated prior to deposition into the cavity (1110).

The method (800) may continue with depositing (810) a second EMC (1115) over the first EMC (1105) upon the first EMC (1105) gelling over a predetermined period of time. As described above, EMC may solidify over a period of time. In one example, this period of time may be between 20 to 60 seconds. In one example, this period of time may be between 10 and 60 seconds. In one example, the first EMC (1105) may be heated prior to depositing the second EMC (1115) into the cavity (1110). In an example, the first EMC (1105) is not allowed to mix with the second EMC (1115) due to the hardening of the first EMC (1105). In an example, the first EMC (1105) is allowed, to a degree, to mix with the second EMC (1115). In this example, the first EMC (1105) and second EMC (1115) are dispensed in the packaging (305) such that the CTE decreases at the location where the first EMC (1105) and second EMC (1115) interface since the first EMC (1105) has a lower CTE than the second EMC (1115).

The method (800) may continue with depositing (815) a circuit (1120) in at least one of the first EMC (1105) and second EMC (1115). In one example, the deposition (815) of the circuit (1120) may be accomplished through the use of a mold tool (1125). The mold tool (1125) may deposit the circuit (1120) or a number of circuits (1120) into to the second EMC (1115) while compressing the first EMC (1105) and second EMC (1115). In one example, at least one mold tool (1125) may deposit multiple layers of different EMCs of different compositions. In a number of examples, the mold tool (1125) can dispense different layer thicknesses, layer sequences, and pattern the EMCs in an X-Y plane perpendicular to the extrusion direction.

Figure 11C:
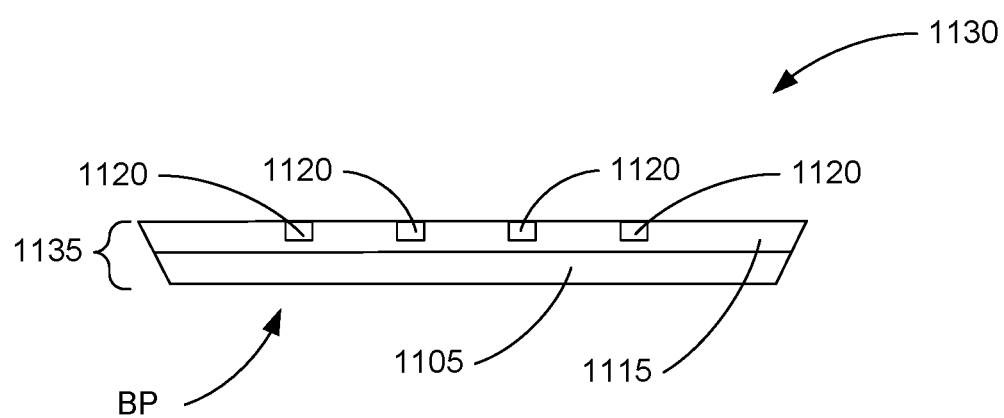

FIG. 11C is a block diagram of the fluidic circuit package at, for example, a cooling stage. The mold tool (1125) has compress molded the circuits (1120) into, at least, the second EMC (1115) and the first EMC (1105) and second EMC (1115) are allowed to cool and fully solidify. A back portion (BP) of the formed circuit package (1130) is formed by first EMC (1105). In one example, most of the volume of the circuit packaging (1135) is formed by the first EMC (1105).

The method (800) described in the present specification provides for a method that minimizes the intermixing between the first EMC (1105) and second EMC (1115). This provides for an effective method of controlling bowing or warping of the panel while still allowing for minor intermixing between the first EMC (1105) and second EMC (1115) in order to avoid two distinct EMC layers which may promote delamination.

Figure 12:
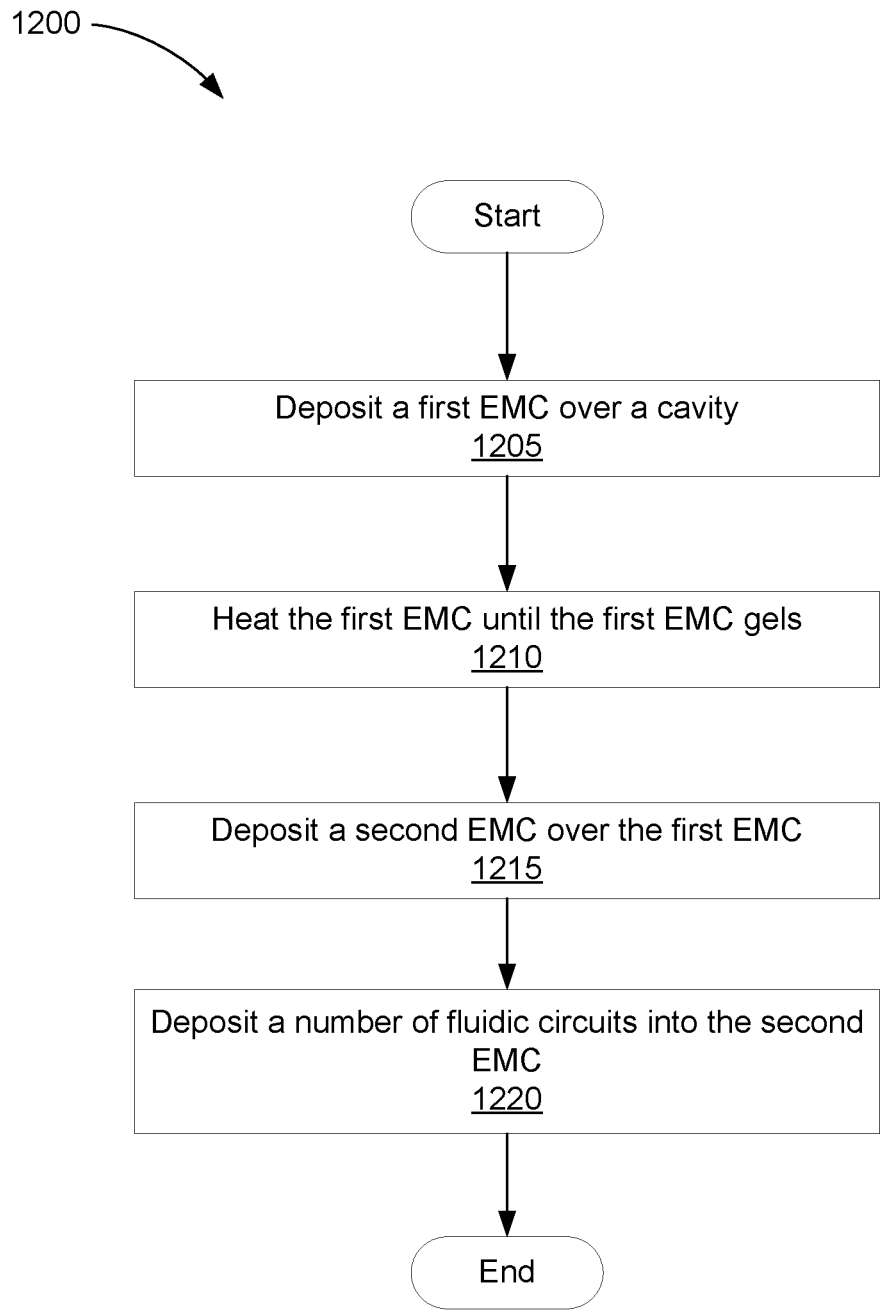
FIG. 12 is a flowchart showing a method of method of forming a fluidic circuit package according to one example of the principles described herein.

FIG. 12 is a flowchart showing a method (1200) of forming a fluidic circuit package (401) according to one example of the principles described herein. The method (1200) may begin with depositing a first EMC (FIG. 7, 707) over a cavity (FIG. 11, 1110). In one example, the first EMC (FIG. 7, 707) may include a number of fluid holes (FIG. 7, 723) defined therein. As described above, a number of features defined on the cavity (FIG. 11, 1110) may prevent the first EMC (FIG. 7, 707) from accumulating at certain locations where a number of fluid holes (FIG. 7, 723) are to be formed. As described above, these fluid holes (FIG. 7, 723) may be used to convey a pint fluid from a fluid source in, for example, a printing device, to a number of fluid circuit devices (FIG. 7, 703).

The method (1200) may continue with heating (1210) the first EMC (FIG. 7, 707) until the first EMC (FIG. 7, 707) gels. As described above, the first EMC (FIG. 7, 707) may gel within 5 seconds to 60 seconds from heating of the first EMC (FIG. 7, 707). The gelling of the first EMC (FIG. 7, 707) prevents a majority of the first EMC (FIG. 7, 707) from mixing with a second EMC (709) deposited over the first EMC (FIG. 7, 707) in a later process.

The method (1200) may continue by depositing (1215) a second EMC (FIG. 7, 709) over the first EMC (FIG. 7, 707). In one example, the second EMC (FIG. 7, 709) has a coefficient of thermal expansion (CTE) relatively higher than the CTE of the first EMC (FIG. 7, 707). In one example, the relatively high CTE value of the second EMC (FIG. 7, 709) may help to counteract the bowing or warping of the fluidic circuit package resulting from the differing CTE values associated with the second EMC (FIG. 7, 709) and the fluid circuit devices (FIG. 7, 703). It may be challenging to match an EMC CTE value with the CTE value of a silicon used to make the fluid circuit devices (FIG. 7, 703). In one example the CTE value of the fluid circuit devices (FIG. 7, 703) may be about 3.1 ppmPC. In one example, the CTE value of the EMC may be about 8 ppm/° C. A CTE mismatch may cause panel bow of up to 10 mm in some examples. The panel bowing hinders various aspects of product design such as silicon thickness, panel thickness, substrate handling down stream of mold process, among others. The present method and packagings allow for relatively better control of the bowing of the packaging. In one example, the effective CTE value of the second EMC (FIG. 7, 709) and the fluid circuit devices (FIG. 7, 703) may equal the CTE value of the first EMC (FIG. 7, 707).

The method (1200) may continue with depositing (1220) a number of fluid circuit devices (FIG. 7, 703) into the second EMC (FIG. 7, 709). as described above, this may be done by implementing a mold tool (FIG. 11B, 1125) that carries the fluid circuit devices (FIG. 7, 703) and compresses the fluid circuit devices (FIG. 7, 703) into the first EMC (FIG. 7, 707) and second EMC (FIG. 7, 709). During the compression molding process, the fluid holes (FIG. 7, 723) may be formed as the first EMC (FIG. 7, 707) has gelled and the second EMC (FIG. 7, 709) has been deposited (1215) over the first EMC (FIG. 7, 707). The compression of the two EMCs (709, 707) may provide time in which both EMCs (707, 709) may further gel around the features of the cavity (FIG. 11, 1110) thereby creating the fluid holes (FIG. 7, 723) described above.

Some of the examples packagings described in this specification include multiple EMCs having different CTEs. In an example, the CTEs of the EMCs described herein can be determined by a weight percentage of fillers in the epoxy mold compound. For example, the CTE is inversely proportional to a filler concentration in the compound. In one example, a first epoxy mold compound may have a weight percentage of fillers of approximately 90%, corresponding to a CTE of approximately 6 ppm/C. An example of an industry standard epoxy mold compound having such characteristics is CEL400ZHF40W from Hitachi Chemical, Ltd®. In one example, a second epoxy mold compound may have a weight percentage of fillers of approximately 87% and a CTE of approximately 9 ppm/C. An example of an industry standard epoxy mold compound having such characteristics is CEL400ZHF40W-87. In other examples, the weight percentage of filler in a first epoxy mold compound can be between 87 and 91%. For example, the CTE of the first epoxy mold compound can be between approximately 6 and 9 ppm/C. In another example, the weight percentage of filler in a second epoxy mold compound can be between 82 and 87%. For example, the CTE of the second epoxy mold compound is between 9 and 14 ppm/C. A different example of different CTEs of the first and second epoxy mold compounds is 6 ppm/C and 13 ppm/C, respectively. An example of a CTE value of a circuit device may be composed is approximately 3.1 ppm/° C.

The specification and figures describe a circuit package. The circuit package described herein reduces the bowing or warping of a circuit package. The product design space in forming the circuit package may be increased with the ability to create circuit packages with relatively larger circuit thicknesses, circuit panel thicknesses, among others. The method described herein also allows for better control of bowing or warping of the panel while still allowing for minor intermixing between a first EMC and a second EMC in order to avoid two distinct EMC layers which may promote delamination.

The preceding description has been presented to illustrate and describe examples of the principles described. This description is not intended to be exhaustive or to limit these principles to any precise form disclosed. Many modifications and variations are possible in light of the above teaching.

What is claimed is:

1. A circuit package, comprising:
a packaging; and
a circuit device in the packaging, wherein the packaging comprises a first EMC having a first coefficient of thermal expansion (CTE), and a second EMC having a second CTE higher than the first CTE, and wherein the second EMC is on the first EMC that has gelled over time.

2. The circuit package of claim 1, wherein the first EMC has a higher weight percentage of fillers than the second EMC.

3. The circuit package of claim 1, wherein a thickness of the second EMC is less than a thickness of the first EMC.

4. The circuit package of claim 1, wherein the packaging comprises a plurality of layers of the first EMC.

5. The circuit package of claim 1, wherein the packaging comprises a plurality of layers of the second EMC.

6. The circuit package of claim 1, wherein the circuit device includes fluid channels, and the packaging comprises fluid holes that open into the fluid channels.

7. The circuit package of claim 1, wherein the circuit device extends through the second EMC such that a back portion of the circuit device is molded into the first EMC.

8. The circuit package of claim 1, wherein the first EMC comprises fluid holes defined in the first EMC.

9. The circuit package of claim 1, wherein the circuit device is a fluidic circuit device, and wherein the first EMC comprises a fluid hole aligned with the fluidic circuit device.

10. The circuit package of claim 9, wherein the fluidic circuit device comprises nozzles.

11. The circuit package of claim 1, wherein the circuit device comprises fluidic circuit devices, and wherein the first EMC comprises fluid holes that are aligned with the fluidic circuit devices.

12. The circuit package of claim 11, wherein the fluidic circuit devices comprise an array of the fluidic circuit devices.

13. A circuit package, comprising:
a packaging; and
a fluidic circuit device in the packaging, wherein the packaging comprises a first EMC and a second EMC on the first EMC that has gelled over time, and wherein the first EMC comprises a fluid hole that is aligned with the fluidic circuit device.

14. The circuit package of claim 13, wherein the fluidic circuit device comprises nozzles.

15. The circuit package of claim 13, wherein the first EMC comprises a plurality of fluid holes.

16. The circuit package of claim 13, wherein the first EMC has a higher weight percentage of fillers than the second EMC.

17. The circuit package of claim 13, wherein a layer of the second EMC is thinner than a layer of the first EMC.

18. The circuit package of claim 13, wherein the second EMC has a higher thermal conductivity than the first EMC.

* * * * *